US012641823B2

(12) United States Patent
Martinez-Limia et al.

(10) Patent No.: US 12,641,823 B2
(45) Date of Patent: May 26, 2026

(54) SEMICONDUCTOR COMPONENT AND METHOD FOR MANUFACTURING A SEMICONDUCTOR COMPONENT

(71) Applicant: Robert Bosch GmbH, Stuttgart (DE)

(72) Inventors: Alberto Martinez-Limia, Tuebingen (DE); Alfred Goerlach, Kusterdingen (DE); Holger Bartolf, Ofterdingen (DE); Stephan Schwaiger, Bodelshausen (DE); Wolfgang Feiler, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 784 days.

(21) Appl. No.: 17/606,680

(22) PCT Filed: Mar. 25, 2020

(86) PCT No.: PCT/EP2020/058305
§ 371 (c)(1),
(2) Date: Dec. 14, 2021

(87) PCT Pub. No.: WO2020/221517
PCT Pub. Date: Nov. 5, 2020

(65) Prior Publication Data
US 2022/0209006 A1      Jun. 30, 2022

(30) Foreign Application Priority Data

Apr. 30, 2019    (DE) ..................... 10 2019 206 148.6

(51) Int. Cl.
*H10D 30/66*          (2025.01)
*H10D 30/01*          (2025.01)
(Continued)

(52) U.S. Cl.
CPC ....... *H10D 30/668* (2025.01); *H10D 30/0297* (2025.01); *H10D 62/8325* (2025.01);
(Continued)

(58) Field of Classification Search
CPC .......... H01L 29/7813; H01L 21/26586; H01L 29/1608; H01L 29/2003; H01L 29/66734;
(Continued)

(56) References Cited

U.S. PATENT DOCUMENTS

| | | | | |
|---|---|---|---|---|
| 9,887,287 | B1 * | 2/2018 | Lichtenwalner | ..... H10D 62/126 |
| 10,199,466 | B1 * | 2/2019 | Kyogoku | ............. H10D 12/031 |

(Continued)

FOREIGN PATENT DOCUMENTS

| | | | |
|---|---|---|---|
| DE | 102017207848 | * | 11/2018 |
| DE | 102017207848 | A1 | 11/2018 |

(Continued)

OTHER PUBLICATIONS

International Search Report for PCT/EP2020/058305 Issued Jun. 10, 2020.

*Primary Examiner* — Benjamin Tzu-Hung Liu
(74) *Attorney, Agent, or Firm* — NORTON ROSE FULBRIGHT US LLP

(57) ABSTRACT

A semiconductor component. The semiconductor component includes a semiconductor substrate that includes a first side, on which an epitaxial layer is situated. On the epitaxial layer, body regions are sectionally situated, and on the body regions, source regions are situated. A plurality of first trenches and a plurality of second trenches extending starting from the source regions into the epitaxial layer. The first trenches have a greater depth than the second trenches. A second trench sectionally extends into a first trench in each case. On a trench surface of the first trenches, a layer including a first doping is situated in each case. The first trenches are filled with a first material including a second doping, the first doping having a higher value than the second doping.

12 Claims, 3 Drawing Sheets

(51) Int. Cl.

| | |
|---|---|
| *H10D 62/832* | (2025.01) |
| *H10D 62/85* | (2025.01) |
| *H10D 84/00* | (2025.01) |
| *H10P 30/20* | (2026.01) |

(52) U.S. Cl.
CPC ....... *H10D 62/8503* (2025.01); *H10D 84/146* (2025.01); *H10P 30/222* (2026.01)

(58) Field of Classification Search
CPC .............. H01L 29/7806; H10D 30/668; H10D 30/0297; H10D 62/8325; H10D 62/8503; H10D 84/146; H10P 30/222
See application file for complete search history.

(56) References Cited

U.S. PATENT DOCUMENTS

| | | | |
|---|---|---|---|
| 2014/0264569 A1 | 9/2014 | Yedinak et al. | |
| 2016/0005827 A1 * | 1/2016 | Nakano ................ | H10D 62/104 257/77 |
| 2018/0337275 A1 * | 11/2018 | Shimizu ............... | H10D 62/157 |
| 2020/0058760 A1 * | 2/2020 | Joshi ................... | H10D 62/111 |

FOREIGN PATENT DOCUMENTS

| | | | |
|---|---|---|---|
| EP | 1544920 A2 | 6/2005 | |
| JP | 2014175313 A | 9/2014 | |
| JP | 2014216410 A | 11/2014 | |
| JP | 2016136618 A | 7/2016 | |
| JP | 2018186270 A | 11/2018 | |
| WO | 2015042146 A1 | 3/2015 | |
| WO | 2018225600 A1 | 12/2018 | |

* cited by examiner

Figure 5:
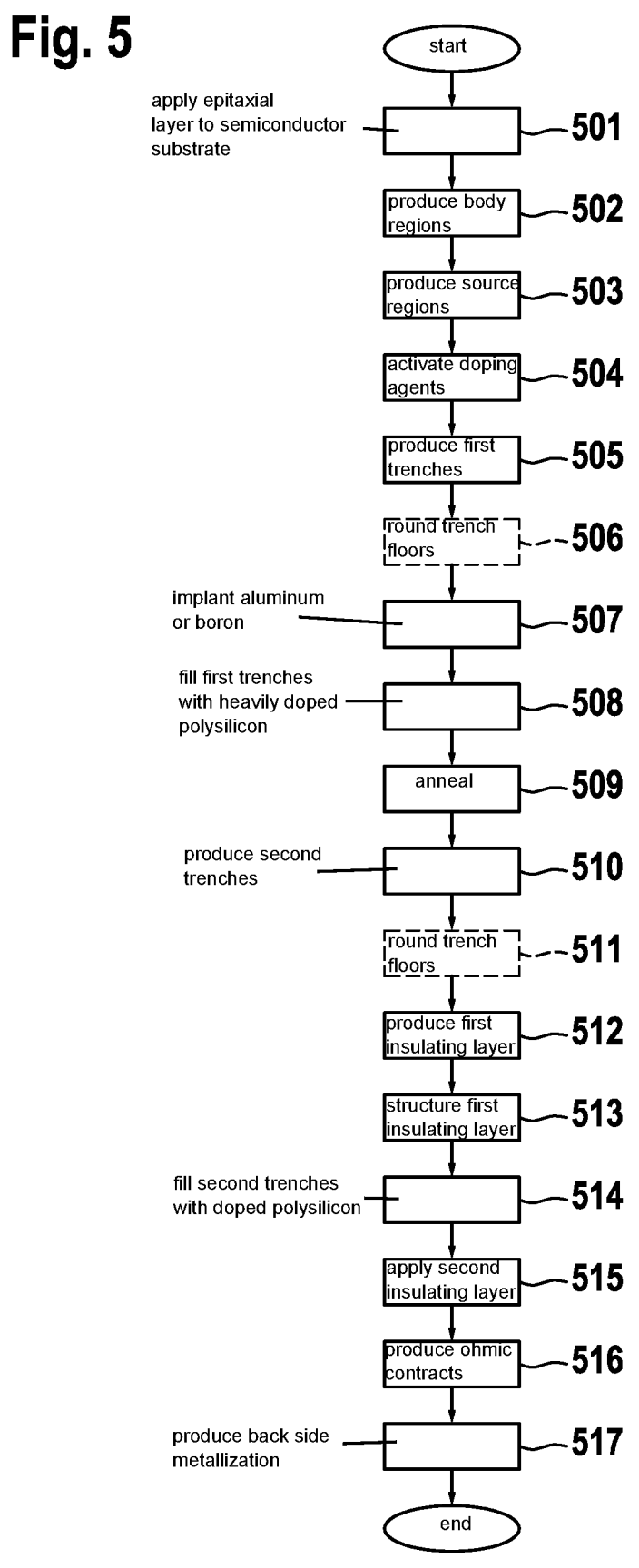

Fig. 5 start apply epitaxial
layer to semiconductor — 501
substrate produce body — 502
regions produce source — 503
regions activate doping — 504
agents produce first — 505
trenches round trench — 506
floors implant aluminum — 507
or boron fill first trenches
with heavily doped — 508
polysilicon anneal — 509 produce second — 510
trenches round trench — 511
floors produce first — 512
insulating layer structure first — 513
insulating layer fill second trenches — 514
with doped polysilicon apply second — 515
insulating layer produce ohmic — 516
contracts produce back side — 517
metallization end

SEMICONDUCTOR COMPONENT AND METHOD FOR MANUFACTURING A SEMICONDUCTOR COMPONENT

FIELD

The present invention relates to a semiconductor component as well as a method for manufacturing a semiconductor component.

BACKGROUND INFORMATION

Semiconductor components on silicon carbide have approximately seven times the breaking strength of semiconductor components on silicon. It is thus necessary to shield the gate oxide from high field intensities in the case of high positive voltages between drain and source during blocking operation. In silicon carbide substrates, the currents are high in the case of a short circuit due to the high doping of the epitaxial layer and the small thickness of the epitaxial layer, so that these currents must be delimited. With the aid of deep p-doped regions, which are introduced specifically for this purpose and form a pronounced JFET effect, i.e., the current path is throttled with increasing voltage, the electric field is shielded in the case of blocking and the current is also delimited in the case of a short circuit.

The deeply introduced, structured p-doped regions are produced with the aid of high energy implantation. In this case, the implantation extends over the body region into the epitaxial layer, so that the gate oxide may be shielded from high electric field intensities. To produce the deep p-doped regions, energies of more than 1 MeV are necessary. Not only does this lead to high manufacturing costs, but it may also result in considerable damage to the semiconductor crystal as well as lateral ion scattering at the expense of the pitch measure.

An object of the present invention is to overcome these disadvantages.

SUMMARY

In accordance with an example embodiment of the present invention, a semiconductor component includes a semiconductor substrate that includes a first side, on which an epitaxial layer is situated. Body regions are sectionally situated on the epitaxial layer. Source regions are situated on the body regions. Starting from the source regions, a plurality of first trenches and a plurality of second trenches extend into the epitaxial layer. The first trenches have a greater depth than the second trenches. A second trench sectionally extends into a first trench in each case. According to an example embodiment of the present invention, a layer including a first doping concentration is situated on a trench surface of the first trenches in each case. The first trenches are filled with a first material, the first material including a second doping concentration. The first doping concentration has a higher value than the second doping concentration.

An advantage here is that the semiconductor component has low gate-drain capacitances, a high blocking stability, and a high short-circuit stability.

In one refinement of the present invention, metal areas are sectionally situated directly on the epitaxial layer.

It is advantageous in this case that a Schottky diode is monolithically integrated into the semiconductor component and connected in parallel to the body diode, so that a stable reverse operation is possible in the case of low forward voltages and low reverse currents.

In a further embodiment of the present invention, on a trench surface of the second trenches, a first insulating layer is situated that has a higher dielectric constant than silicon dioxide, the second trenches being filled with a second material. In other words, the relative dielectric constant has a value higher than 3.9.

An advantage here is that the gate-drain capacitances are low.

In one refinement of the present invention, the first insulating layer has a constant thickness.

It is advantageous in this case that it is easy to manufacture.

In a further embodiment of the present invention, the first insulating layer has a different thickness at the side walls of the trench surface of the second trenches.

An advantage here is that the shielding of the gate terminals is high in the case of blocking.

In one refinement of the present invention, the semiconductor substrate includes silicon carbide.

In a further embodiment of the present invention, the semiconductor component is a MISFET.

In one refinement of the present invention, the semiconductor substrate includes gallium nitride.

A method according to an example embodiment of the present invention for manufacturing a semiconductor component includes applying an epitaxial layer to a semiconductor substrate, producing body regions that are sectionally situated on the epitaxial layer, and producing source regions that are situated on the body regions. The method further includes producing first trenches, which extend from a surface of the source regions into the epitaxial layer, producing a layer on the trench surfaces of the first trenches, the layer including a first doping concentration, and filling first trenches with a heavily p-doped polysilicon. The method further includes producing second trenches, which extend from the surface of the source regions into the epitaxial layer and sectionally reach into the first trenches, producing a first insulating layer on the trench surfaces of the second trenches, and filling the second trenches with a heavily n-doped polysilicon as well as producing a second insulating layer above the source regions, producing ohmic contacts, and producing a back side metallization.

Further advantages result from the following description of exemplary embodiments.

BRIEF DESCRIPTION OF THE DRAWINGS

The present invention is elucidated below based on preferred specific embodiments and the figures.

FIG. 5 shows a method for manufacturing a semiconductor component, in accordance with an example embodiment of the present invention.

DETAILED DESCRIPTION OF EXAMPLE EMBODIMENTS

Figure 1:
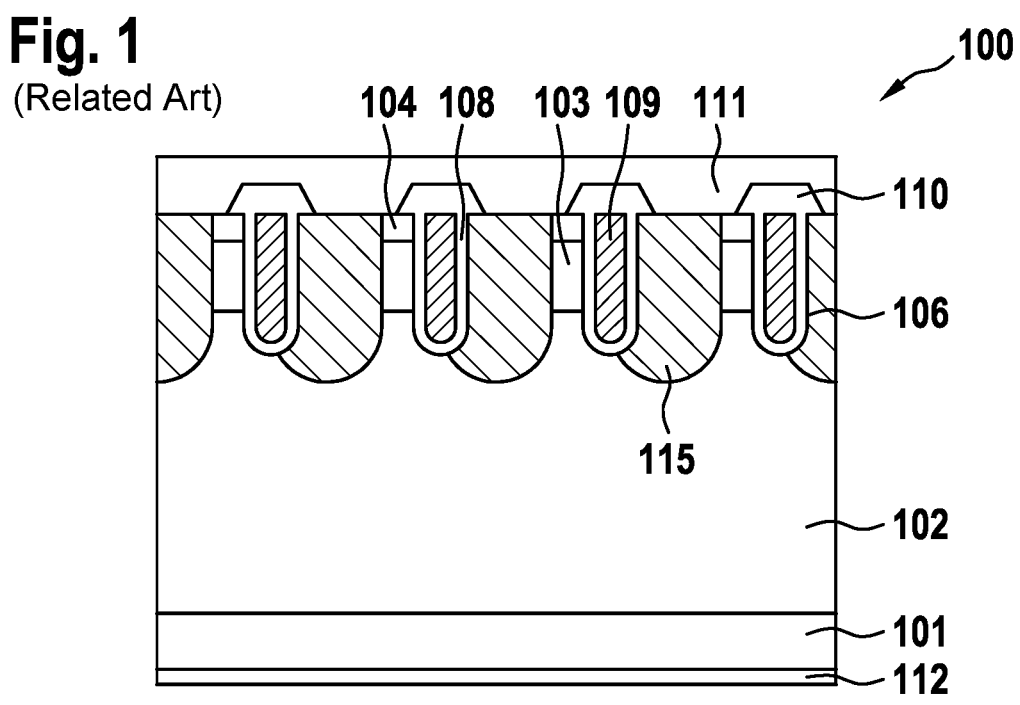
FIG. 1 shows the transistor cells of a MISFET from the related art.

FIG. 1 shows the transistor cells of a metal insulator semiconductor field effect transistor 100, a so-called MIS- FET, from the related art. MISFET 100 includes a heavily n-doped semiconductor substrate 101, for example of SiC. On semiconductor substrate 101, a lightly n-doped epitaxial layer 102 is situated. On epitaxial layer 102, moderately p-doped body regions 103 are sectionally situated. On body regions 103, flat, very heavily n-doped source regions 104 are situated. Starting from a top side of source regions 104, implanted, tub-shaped p-doped regions 115 and a plurality of second trenches 106 extend into epitaxial layer 102. Second trenches 106 sectionally extend into implanted, tub-shaped regions 115. In other words, second trenches 106 partially overlap implanted, tub-shaped regions 115. Implanted, tub-shaped regions 115 have a greater depth than second trenches 106, i.e., they reach deeper into epitaxial layer 102. Implanted, tub-shaped regions 115 have heavily p-doped polysilicon. The heavily p-doped polysilicon is manufactured with the aid of high-energy implantation using aluminum, for example. In each case, a trench wall of second trenches 106 is in contact with a body region 103 and a source region 104. The trench surfaces of second trenches 106 have an oxide layer 108 made of thin silicon dioxide. Second trenches 106 are filled with a heavily n-doped polysilicon, the so-called gate poly. On the wafer surface, i.e., above source region 104 and implanted, tub-shaped regions 115, an insulating layer 110 is sectionally situated. On insulating layer 110 and the wafer surface, a first metal layer 111 is situated. It forms, together with source regions 104 and implanted, tub-shaped regions 115, ohmic contacts representing the source contacts. Below semiconductor substrate 101, a second metal layer 112 is situated. It functions as a drain contact. The gate poly is electrically connected to a metal terminal (not shown in FIG. 1), the so-called gate pad. In most cases, this takes place via one or multiple heavily doped polysilicon strip conductors, the so-called gate runners.

Figure 2:
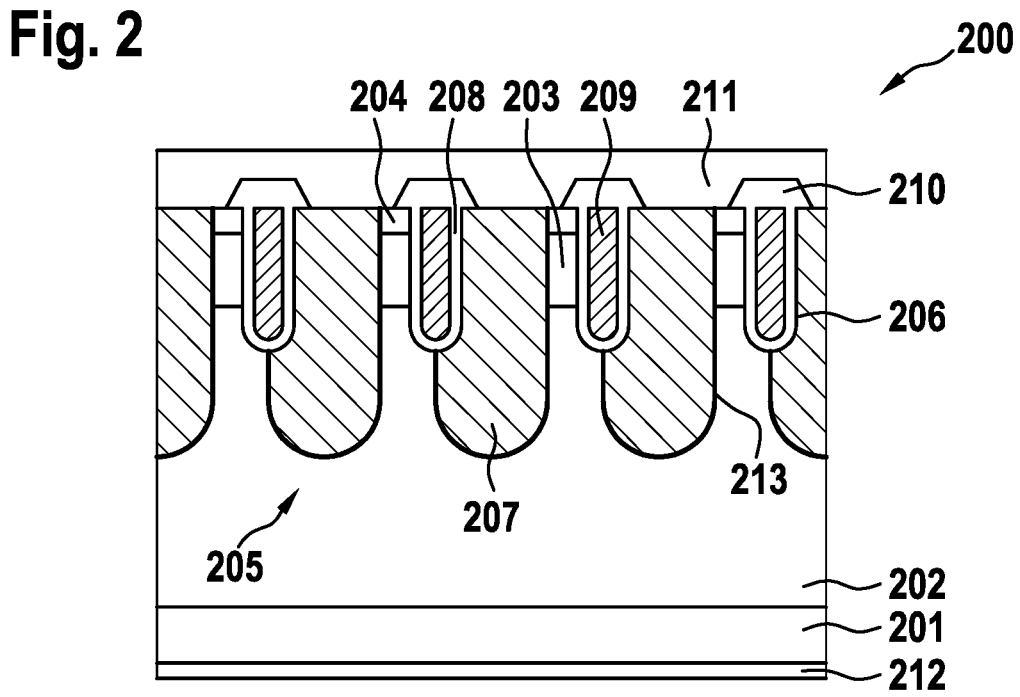
FIG. 2 shows the cells of a first exemplary embodiment of a semiconductor component, in accordance with the present invention.

FIG. 2 shows the cells of a first exemplary embodiment of a semiconductor component 200 that includes a semiconductor substrate 201. Semiconductor substrate 201 includes a first side and a second side, the first side being opposite the second side. On the first side of semiconductor substrate 201, an epitaxial layer 202 is situated. On epitaxial layer 202, body regions 203 are sectionally situated. On body regions 203, source regions 204 are situated. Starting from a top side of source regions 204, a plurality of first trenches 205 and a plurality of second trenches 206 extend into epitaxial layer 202. Second trenches 206 sectionally extend into first trenches 205. In other words, second trenches 206 partially overlap first trenches 205. First trenches 205 have a greater depth than second trenches 206, i.e., they reach deeper into epitaxial layer 202. In each case, a trench wall of second trenches 206 is in contact with a body region 203 and a source region 204. The trench surfaces of second trenches 206 include a first insulating layer 208, the so-called gate dielectric. In general, an oxide layer is used in this case. First insulating layer 208 may have a thickness of 50 nm, for example. This means that the thickness of first insulating layer 208 is constant, so that the filling of second trenches 206 is symmetrical. The gate dielectric may preferably have a higher dielectric constant than silicon dioxide. This means that relative dielectric constant $\varepsilon_r$ has a higher value than 3.9. First insulating layer 208 includes $Al_2O_3$, $HfO_3$ or $TiO_2$, for example. The breaking field intensities of $HfO_3$ and $TiO_2$ are lower than in the case of $SiO_2$, but the field intensities within the gate dielectric are lower than in the case of $SiO_2$ due to the higher relative dielectric constant. For this reason, insulating layers 208 may be even thinner than in the case of $SiO_2$. Alternatively, first insulating layer

208 may include a combination of $SiO_2$ and a material having a higher dielectric constant, i.e., a layer stack made from a thin $SiO_2$ layer and a thicker $Al_2O_3$ layer is produced, for example. On the wafer surface, i.e., above source regions 204 and first trenches 205, a second insulating layer 210 is sectionally situated. On second insulating layer 210 and the wafer surface, a first metal layer 211 is situated. It forms, together with source regions 204 and first trenches 205, ohmic contacts representing the source contacts. On the second side of semiconductor substrate 201, i.e., below semiconductor substrate 201, a second metal layer 212 is situated. It functions as a drain contact.

Semiconductor substrate 201 has SiC, for example. Epitaxial layer 202 is lightly n-doped SiC. Trench walls 213 of first trenches 205 include a very heavily doped 4H-SiC. First trenches 205 are filled with a heavily p-doped polysilicon. A heterojunction between 4H-SiC and the p-doped polysilicon thus forms, first trenches 205 having a depth of 0.5 μm through 10 μm. First trenches 205 have a distance from one another of 0.2 μm through 10 μm. The shielding effect with regard to the electric field is thus improved and the short circuit stability increased. Second trenches 206 are filled with a heavily n-doped polysilicon, the so-called gate poly. Body region 203 includes p-doped SiC and source regions 204 include a heavily n-doped SiC.

Figure 3:
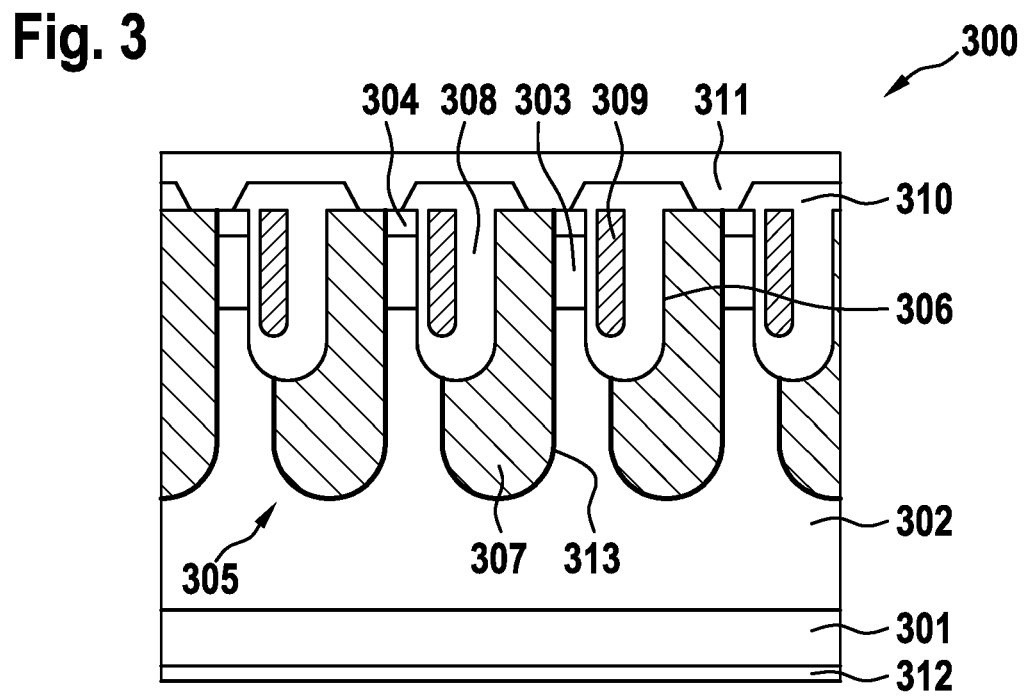
FIG. 3 shows the cells of a second exemplary embodiment of a semiconductor component, in accordance with the present invention.

FIG. 3 shows the cells of a second semiconductor component 300. The design of second semiconductor component 300 essentially corresponds to the design of first semiconductor component 200 from FIG. 2, the internal design of the filling of second trenches 306 of second semiconductor component 300 differing from the internal design of the filling of second trenches 206 of first semiconductor component 200. Identical last digits of the reference numerals from FIG. 3 denote the same elements as in FIG. 2. The trench surfaces of second trenches 306 of second semiconductor component 300 include a first insulating layer 308, first insulating layer 308 having different thicknesses at the side walls of second trenches 306 and at the trench floor. In this case, an area of first insulating layer 308 that is directly adjacent to a first trench 305 is thicker than on the side opposite this area. In addition or alternatively, first insulating layer 308 is thicker in the area of the trench floor than at the side walls of second trenches 306. Second trenches 306 are filled with a heavily n-doped polysilicon. In other words, second trenches 306 are filled asymmetrically with regard to a perpendicular bisector of second trenches 306. This reduces the gate-drain capacitance. In addition, the field intensity within the thicker areas of first insulating layer 308 is lower than in the case of a uniform layer thickness.

Figure 4:
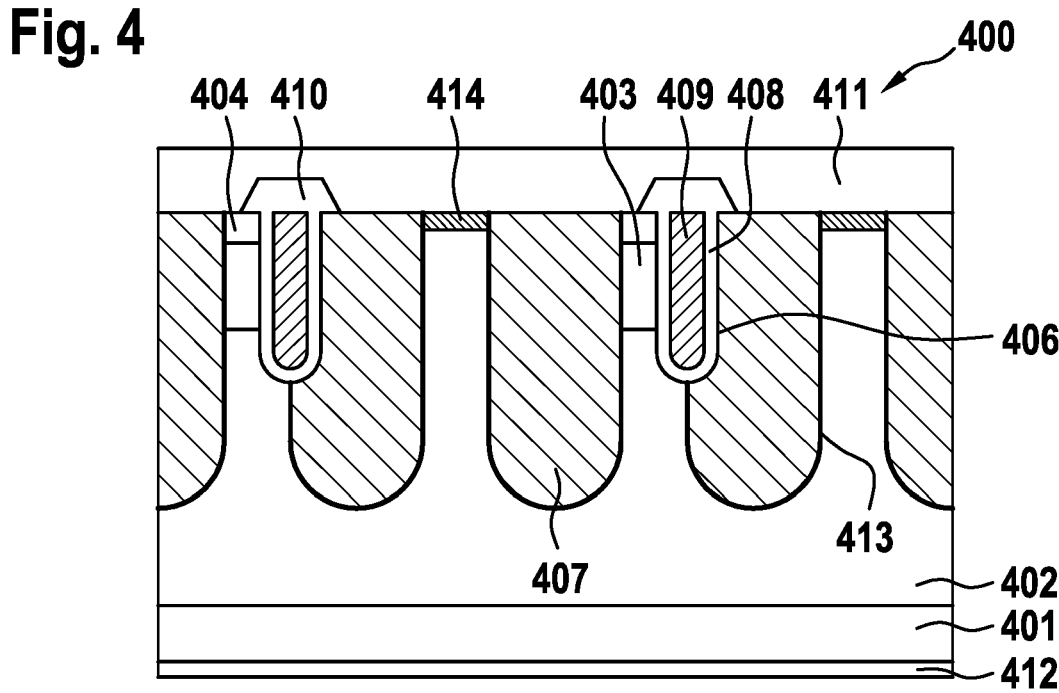
FIG. 4 shows the cells of a third exemplary embodiment of a semiconductor component, in accordance with the present invention.

FIG. 4 shows a cell of a third exemplary embodiment of a semiconductor component 400 including Schottky contacts 414. Third semiconductor component 400 includes a semiconductor substrate 401, for example from SiC. Third semiconductor component 400 is a MOSFET, for example. Compared to a MOSFET based on silicon, the MOSFET based on silicon carbide has disadvantages during inverse or body diode operation. On the one hand, the flux or forward voltages are greater by approximately a factor of 3 due to the greater bandgap, on the other hand, a degradation of the current may occur in SiC during the operation of bipolar structures. This is attributable to the recombination of electrons and gaps that may stimulate the formation of stacking errors from shifts. This is why Schottky diodes having a lower, stable flux voltage are monolithically integrated into third semiconductor component 400. The Schottky diodes form at the junction of Schottky contacts 414 and epitaxial layer 402. The Schottky diodes are connected in parallel to the body diodes, the body diodes forming at the junction between body regions 403 and epitaxial layer 402. The design of third semiconductor component 400 is similar to the design of first semiconductor component 200 from FIG. 2. Identical last digits of the reference numerals from FIG. 4 denote the same elements as in FIG. 2. Third semiconductor component 400 includes an epitaxial layer 402, on which body regions 403 are sectionally situated. On body regions 403, source regions 404 are situated. Metal areas 414 are directly situated on epitaxial layer 402. This means that metal areas 414 are situated at positions of epitaxial layer 402, at which no body regions 403 are present on epitaxial layer 402. In contrast to FIG. 2, the body regions, the source regions, the second trenches, the first insulating layer, the gate poly as well as the second insulating layer is sectionally replaced by metal areas 414. Metal areas 414 include nickel, titanium or molybdenum, for example. As a result of the location of the Schottky contacts between first trenches 405, the electric fields are kept away from the Schottky contacts during blocking operation, since the space-charge zones expanding from first trenches 405 into epitaxial layer 402 are in contact with each other and thus shield the electric field from the Schottky contacts. This results in minor leakage currents, since the barrier-lowering effect at the Schottky contact is prevented. In other words, the shielding structures of the trench regions, i.e., of first trenches 405, reduce the leakage current.

Semiconductor components 200, 300 and 400 are preferably MOSFETs or MISFETs. They may be used in inverters for electric vehicles or hybrid vehicles. Furthermore, they may be used for regenerative energy generation, for example in inverters of photovoltaic or wind power plants. Moreover, an application in train drives and in high voltage rectifiers is possible.

FIG. 5 shows a method 500 for manufacturing a semiconductor component. Method 500 starts with a step 501 in that an epitaxial layer is applied to a semiconductor substrate. The material of the epitaxial layer has the same material as the semiconductor substrate, but with a different doping agent concentration. The epitaxial layer is lightly n-doped. In a subsequent step 502, body regions are produced that are sectionally situated on the epitaxial layer. This takes place with the aid of lithography and ion implantation. The body regions are p-doped. In a subsequent step 503, source regions are produced that are situated on the body regions. The source regions are heavily n-doped. In a subsequent step 504, the doping agents are activated with the aid of thermal treatment. In a subsequent step 505, first trenches are produced that extend from a surface of the source regions into the epitaxial layer. The first trenches are produced with the aid of hard masks and reactive etching. In a subsequent step 506, the trench floors may be optionally rounded. In a following step 507, aluminum or boron is implanted into the trench surfaces of the first trenches. In a subsequent step 508, the first trenches are filled with heavily doped polysilicon, p-doped or n-doped. Alternatively, the first trenches may be filled with p-doped or n-doped 3C-SiC. In a subsequent step 509, an annealing step is carried out. In a subsequent step 510, second trenches are produced that extend from the surface of the source regions into the epitaxial layer and sectionally reach into the first trenches. In an optional step 511, the trench floors of the second trenches are rounded. In a subsequent step 512, a first insulating layer is produced on the trench surfaces of the second trenches. In a subsequent step 513, the first insulating layer is structured. Here, the first insulating layer may have a constant thickness or the side walls as well as the trench floor may have a different thickness. In a subsequent step 514, the second trenches are filled with doped polysilicon. In a subsequent step 515, a second insulating layer is applied above the source regions. In a subsequent step 516, ohmic contacts are produced and in a subsequent step 517, a back side metallization is produced.

What is claimed is:

1. A semiconductor component, comprising:
    a semiconductor substrate that includes a first side, on which an epitaxial layer is situated;
    body regions sectionally situated on the epitaxial layer body regions;
    source regions situated on the body regions;
    wherein a plurality of first trenches and a plurality of second trenches extending starting from the source regions into the epitaxial layer, the first trenches having a greater depth than the second trenches, each of the second trenches sectionally extending into a respective one of the first trenches;
    wherein on a trench surface of each of the first trenches, a layer including a first doping is situated; and
    wherein the first trenches are filled with a first material including a second doping, a first doping concentration having a higher value than a second doping concentration.

2. The semiconductor component as recited in claim 1, wherein metal is sectionally situated directly on the epitaxial layer.

3. The semiconductor component as recited in claim 1, wherein on a trench surface of each of the second trenches, a first insulating layer is situated that has a higher dielectric constant than silicon dioxide, the second trenches being filled with a second material.

4. The semiconductor component as recited in claim 3, wherein the first insulating layer has a constant thickness.

5. The semiconductor component as recited in claim 3, wherein the first insulating layer has a different thickness at side walls of the trench surface of the second trenches.

6. The semiconductor component as recited in claim 3, wherein the first insulating layer comprises a stack of a thin silicon dioxide layer and a thicker aluminum oxide layer, the aluminum oxide layer having a higher relative dielectric constant than silicon dioxide.

7. The semiconductor component as recited in claim 1, wherein the semiconductor substrate includes silicon carbide.

8. The semiconductor component as recited in claim 1, wherein the semiconductor component is a MISFET.

9. The semiconductor component as recited in claim 1, wherein the semiconductor substrate includes gallium nitride.

10. A method for manufacturing a semiconductor component, comprising the following steps:
    applying an epitaxial layer on a semiconductor substrate;
    producing body regions that are sectionally situated on the epitaxial layer;
    producing source regions that are situated on the body regions,
    producing first trenches that extend from a surface of the source regions into the epitaxial layer;
    producing a layer on trench surfaces of the first trenches, the layer having a first doping concentration;
    filling the first trenches with a heavily p-doped polysilicon;
    producing second trenches that extend from the surface of the source regions into the epitaxial layer and sectionally reach into the first trenches;

producing a first insulating layer on trench surfaces of the second trenches;

filling the second trenches with a heavily p-doped poly-silicon;

producing a second insulating layer above the source regions;

producing ohmic contacts; and producing a back side metallization.

11. A semiconductor component, comprising:

a semiconductor substrate that includes a first side, on which an epitaxial layer is situated;

body regions sectionally situated on the epitaxial layer body regions;

source regions situated on the body regions;

wherein a plurality of first trenches and a plurality of second trenches extending starting from the source regions into the epitaxial layer, the first trenches having a greater depth than the second trenches, each of the second trenches sectionally extending into a respective one of the first trenches;

wherein on a trench surface of each of the first trenches, a layer including a first doping is situated; and wherein the first trenches are filled with a first material including a second doping, a first doping concentration having a higher value than a second doping concentration, wherein metal areas are sectionally situated directly on the epitaxial layer at positions where no body regions are present, such that Schottky contacts are formed between the metal areas and the epitaxial layer, the Schottky contacts being connected in parallel to body diodes.

12. A semiconductor component, comprising:

a semiconductor substrate that includes a first side, on which an epitaxial layer is situated;

body regions sectionally situated on the epitaxial layer body regions;

source regions situated on the body regions;

wherein a plurality of first trenches and a plurality of second trenches extending starting from the source regions into the epitaxial layer, the first trenches having a greater depth than the second trenches, each of the second trenches sectionally extending into a respective one of the first trenches;

wherein on a trench surface of each of the first trenches, a layer including a first doping is situated; and wherein the first trenches are filled with a first material including a second doping, a first doping concentration having a higher value than a second doping concentration, wherein trench walls of the first trenches include heavily doped 4H-SiC, and the first trenches are filled with a heavily p-doped polysilicon, such that a heterojunction is formed between the 4H-SiC and the p-doped poly-silicon.

\* \* \* \* \*